United States Patent [19]

England

[11] Patent Number: 4,636,750

[45] Date of Patent: Jan. 13, 1987

[54] MAGNETRON WITH FREQUENCY SENSOR ARRANGEMENT

[75] Inventor: Melvin G. England, Sunbury-upon-Thames, England

[73] Assignee: Thorn Emi Varian Limited, Hayes, England

[21] Appl. No.: 829,156

[22] Filed: Feb. 14, 1986

[30] Foreign Application Priority Data

Feb. 19, 1985 [GB] United Kingdom ................. 8504219

[51] Int. Cl.[4] .......................... H03B 9/10; H01J 25/50

[52] U.S. Cl. .................................. 331/90; 315/39.61; 324/175

[58] Field of Search ....................... 331/1 R, 5, 86, 88, 331/90; 315/39.55, 39.57, 39.61, 39.59; 250/215, 216, 236, 231 SE; 324/175; 377/53

[56] References Cited

U.S. PATENT DOCUMENTS 3,440,565 4/1969 Scullin et al. ........................... 331/5
3,811,056 5/1974 Baba et al. ..................... 250/231 SE
4,093,853 6/1978 Hunt ............................. 250/231 SE
4,123,653 10/1978 Borio ............................ 250/231 SE
4,387,299 6/1983 Akiyama ........................ 250/231 SE
4,506,339 3/1985 Kuhnlein ............................. 324/175

*Primary Examiner*—Eugene R. LaRoche
*Assistant Examiner*—D. Mis
*Attorney, Agent, or Firm*—Fleit, Jacobson, Cohn & Price

[57] ABSTRACT

In a magnetron a spinner (22), rotatable on a longitudinal axis (x) has a number of evenly spaced markings formed circumferentially on an exterior surface. The markings are sensed, as the spinner rotates, by a photo sensitive transistor (PT) coupled to window (26) in the vacuum envelope of the magnetron by a fiber optic pipe (FP1). The periodicity of pulses, generated by the transistor in response to movement of markings past the window, is divided in a network (43) to generate a succession of further pulses. The further pulses are then counted in circuit (44) and the instantaneous count compared with reference frequency values stored in memory (46) to generate an output signal O/P(1) related to the instantaneous magnetron frequency.

7 Claims, 5 Drawing Figures

MAGNETRON WITH FREQUENCY SENSOR ARRANGEMENT

This invention relates to magnetrons and it relates particularly to magnetrons which have a rotatable tuning member, for example a spin tuned magnetron. Spin tuned magnetrons produce a microwave output of varying frequency and are useful in radar applications requiring frequency agility.

Figure 1:
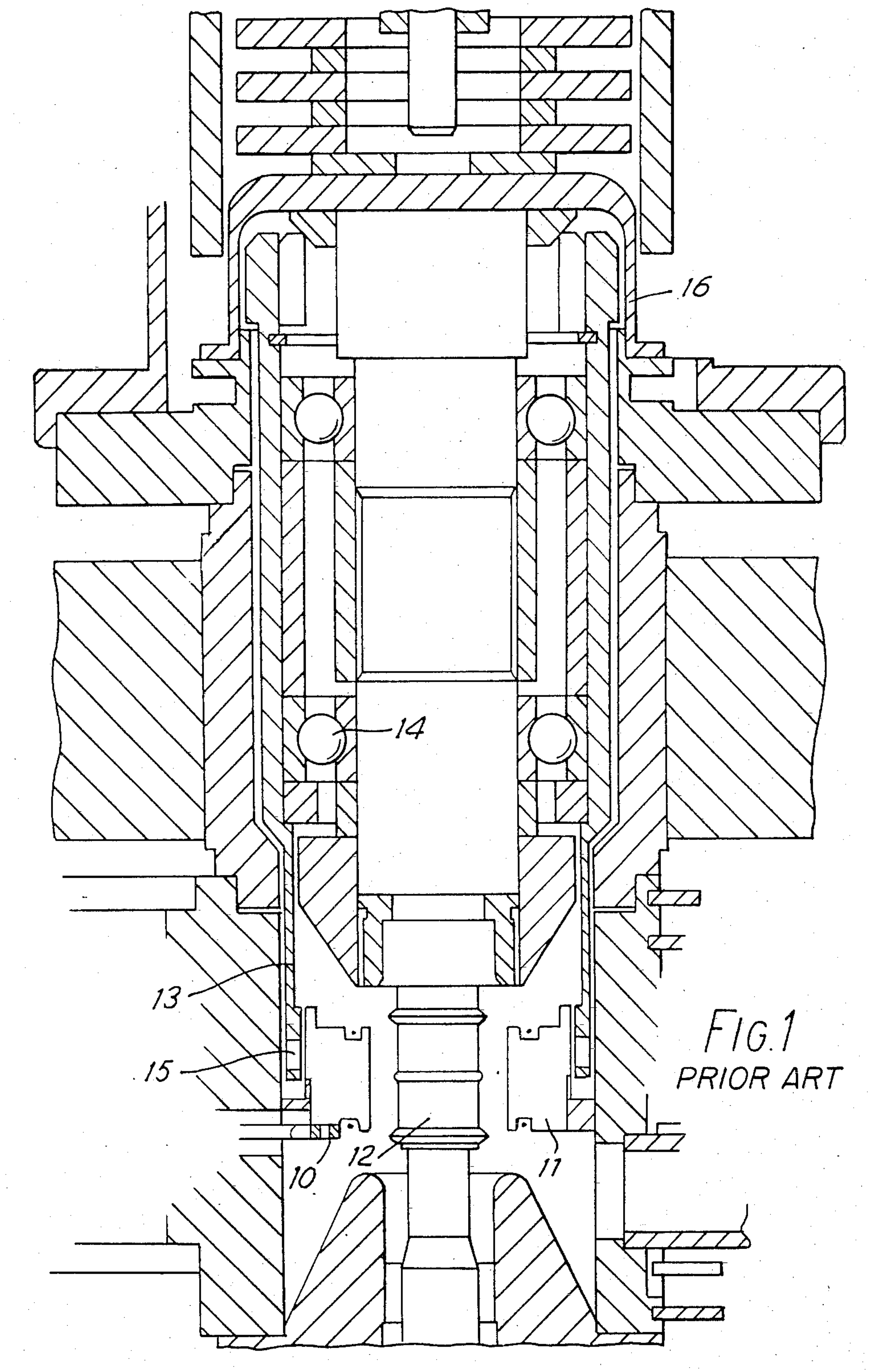
FIG. 1 PRIOR ART

A known form of spin tuned magnetron is shown in FIG. 1 of the accompanying drawings. It comprises an anode 10 in the form of a number (typically, eight) of vanes 11 which surround, and project radially towards, the cathode 12. Only two such vanes are illustrated in FIG. 1. A spinner 13 is mounted on a bearing 14 for rotation about the longitudinal axis of the cathode and is provided with a number of slots 15 arranged around the axis of rotation. As the slots pass across successive anode cavities, defined between adjacent vanes, the resonant frequency of the anode circuit varies and one complete cycle back and forth across the available tuning range occurs each time a slot moves past a cavity. Thus, in the case of an anode consisting of eight evenly spaced vanes and a spinner having eight evenly spaced slots eight complete frequency cycles are obtained for each rotation of the spinner.

It is necessary to provide an indication of the instantaneous magnetron frequency so that the receiver local oscillator can be tuned to the transmitted frequency. It is not desirable to derive the indication from the spinner drive since this is coupled magnetically through the vacuum envelope of the magnetron (shown at 16 in FIG. 1) housing the anode and cathode and may be subject to slip. Any indication derived from the drive may be in error therefore. An alternative approach involves using a capacitive transducer comprising two meshing sets of plates, one set being mounted on the spinner itself, inside the envelope, and the other set being fixed in relation to the spinner. The plates are divided into the same number of segments as there are anode cavities so that a variation in capacitance, resulting from rotation of the spinner, corresponds to the variation in magnetron frequency. The transducer, however, suffers from the disadvantage that it is relatively bulky and is susceptible to interference from local fields within the magnetron. Hall effect devices, responsive to a changing magnetic field caused by rotation of the spinner, have alternatively been used but again these tend to be susceptible to interference from local fields.

It is an object of the present invention to provide a magnetron in which the above-mentioned disadvantages are substantially alleviated.

Accordingly there is provided a magnetron including a rotatable tuning member and a sensing arrangement responsive to rotation of the tuning member to provide an indication of the instantaneous magnetron frequency, said sensing arrangement comprising a plurality of markings provided on the tuning member and spaced apart about the axis of rotation thereof,

- a detector responsive to movement of the markings past a fixed reference position as the tuning member rotates to generate respective first electrical pulses,
- a dividing circuit arranged to divide the period between successive ones of said first electrical pulses into a plurality of sub-periods and to generate respective second electrical pulses,
- and an output circuit responsive to said second electrical pulses to generate an electrical output signal related to the instantaneous magnetron frequency.

Figure 2:
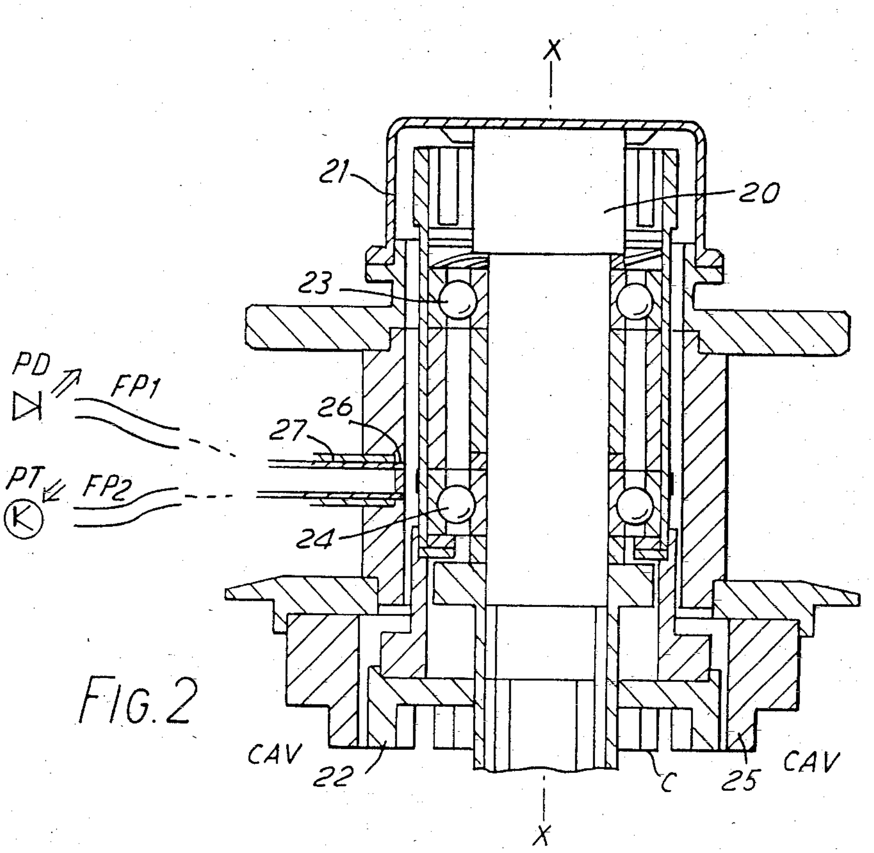
Figure 3:
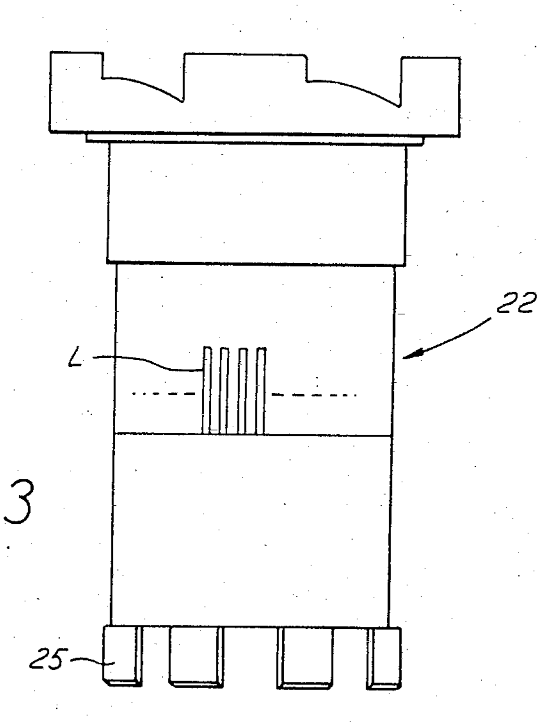
Figure 4:
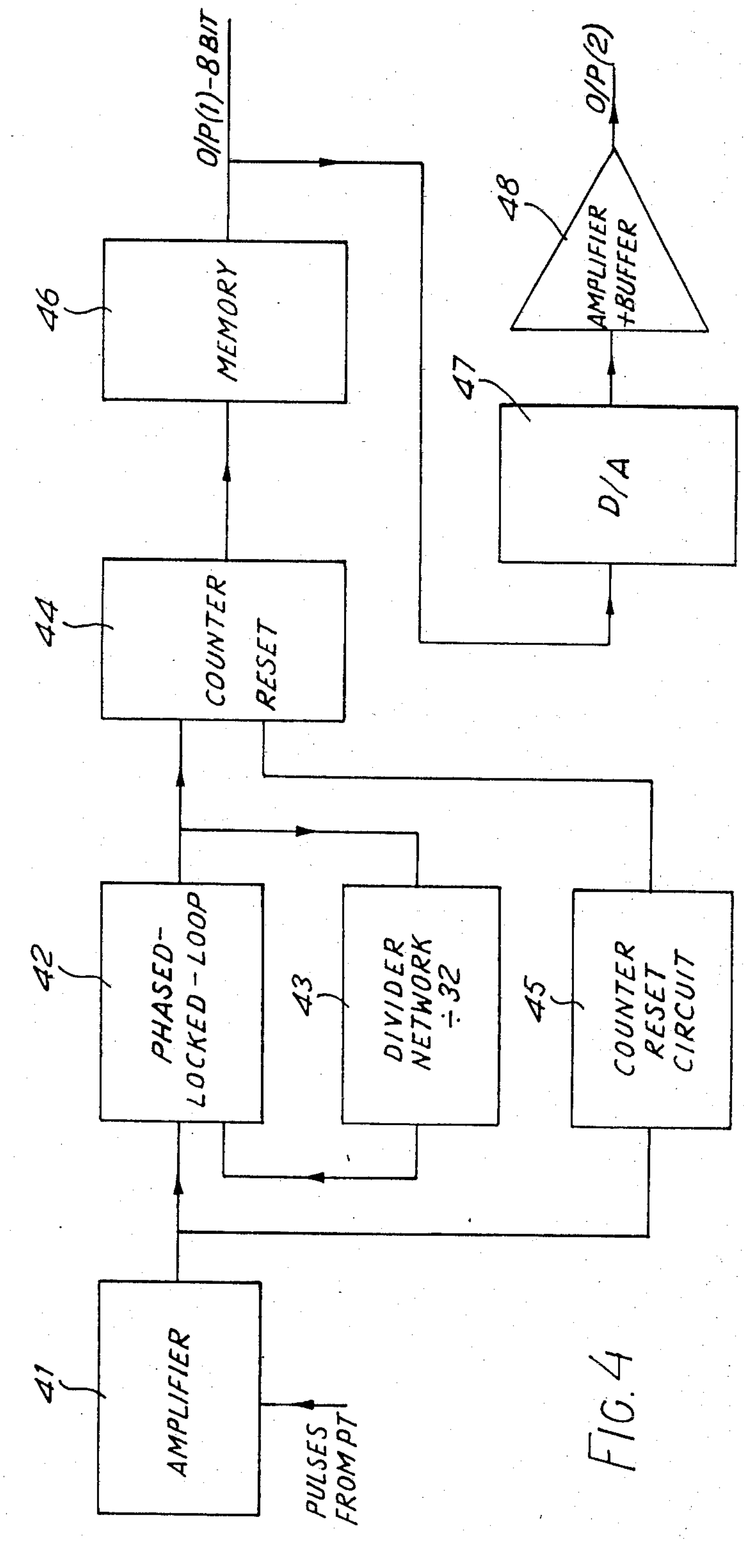
Figure 5:
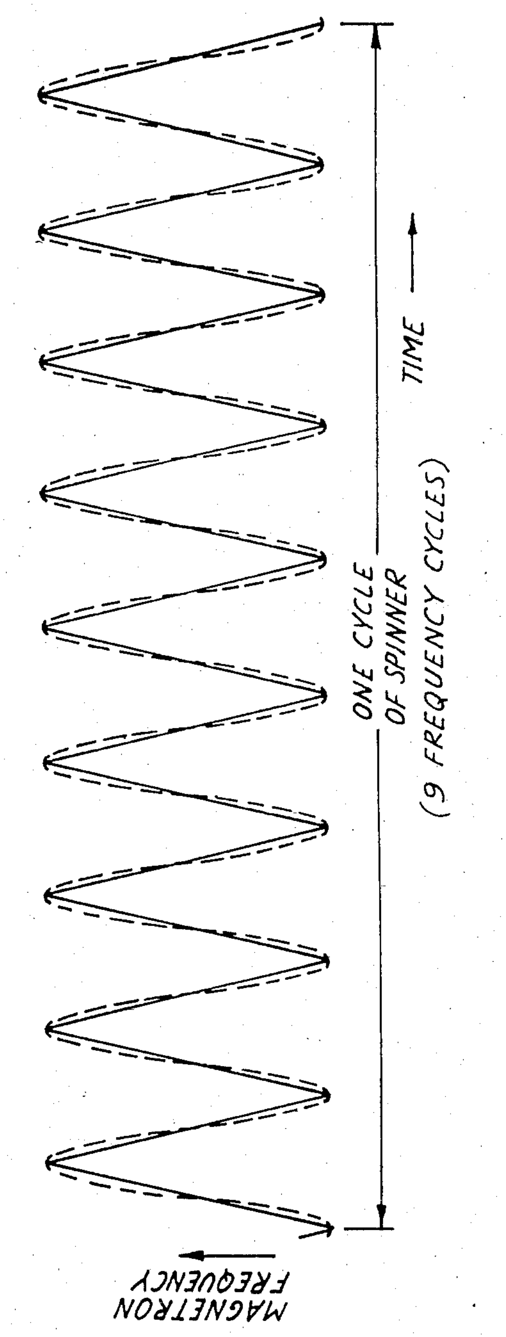

In order that the invention may be more readily understood and carried into effect a specific embodiment thereof is now described by reference to, and as illustrated in, the accompanying drawings of which FIG. 1, referred to hereinbefore, shows a cross-sectional view through a known form of spin tuned magnetron, FIG. 2 illustrates a cross-sectional side view through part of a coaxial magnetron constructed in accordance with the present invention, FIG. 3 shows a side view of the spinner and illustrates markings applied to a surface thereof, FIG. 4 shows a circuit used to process pulses generated in response to rotation of the spinner and, FIG. 5 shows two examples of output signals which could be generated by the circuit of FIG. 4 representing the variation in magnetron frequency occasioned by one complete rotation of the spinner.

FIG. 2 illustrates a cross-sectional view through part of a coaxial magnetron and, as in the above-described example, the cathode shown at 20 is housed within a vacuum envelope 21. The magnetron has a tuning member in the form of a spinner 22 mounted by means of a pair of ball races 23, 24 for rotation about the longitudinal axis XX of the cathode. The spinner is coupled magnetically to a drive shaft mounted outside the envelope but not shown in FIG. 2.

In this particular example the magnetron has 32, fixed anode vanes (not shown in the drawing) spaced evenly around the axis of the cathode. The spinner is provided with nine evenly spaced castellations C which are caused to rotate, in use, relative to an outer, fixed shutter 25 which also has nine, evenly spaced castellations located in the coaxial cavity of the magnetron shown generally at CAV. As the spinner rotates and the castellations C on the spinner 22 move past the spaces between castellations on the shutter 25 the instantaneous magnetron frequency in the coaxial cavity changes. It will be understood that the present invention is applicable to other forms of magnetrons having a rotatable tuning member, of the kind described in relation to FIG. 1, for example.

In accordance with the present invention the spinner has a number of markings located circumferentially on the exterior surface and an indication of the instantaneous magnetron frequency is derived by monitoring movement of the markings past a fixed reference position as the spinner rotates. This provides an indication of the angular position of the spinner and so the frequency excursion of the transmitted microwave energy.

The markings are shown, by way of example, on an exaggerated scale in the side view of the spinner illustrated in FIG. 3. In this example the markings comprise lines L formed by engraving the surface of the spinner although alternative arrangements are envisaged; the markings may be painted on the surface of the spinner, for example, and may comprise lines or dots.

In this example, the spinner has, in effect, 72 lines spaced evenly at intervals of 0.5 mm around the circumference of the spinner; that is eight lines for every frequency cycle in the magnetron response. In practice, for reasons which will become apparent hereinafter, the first line in each group of eight, corresponding to the start of each new frequency cycle, is omitted.

In this example of the invention the magnetron is provided with a glass window shown at 26 in FIG. 2 and light from a photo diode PD is directed through the window to illuminate the markings on the spinner within. Light is transmitted to the window along a fibre optic pipe $FP_1$ and light reflected at the spinner is transmitted along another fibre optic pipe $FP_2$ to a photo sensitive transistor PT which generates an electrical pulse in response to each change in light intensity as occasioned by movement of an engraving past the window. In practice a common fibre optic cable (supplied for example by FORT Fibre Optiques of Paris Ref. BFS) is used to transmit light to and away from the spinner, the cable being bonded into a mounting 27 in the vacuum envelope to abut the window 26.

As the spinner rotates the markings are sensed by the photo sensitive transistor PT which generates a succession of square wave pulses. These are applied to an electrical circuit, shown in FIG. 4, for processing to produce an output signal representing the variation in magnetron frequency.

The pulses are received at an amplifier 41 and passed via a phase-locked loop 42 and a divide-by-32 network 43 to a binary counter 44 which counts pulses corresponding to each frequency cycle, i.e. up to 256 pules (8×32). At the end of each frequency cycle a counter reset circuit 45 is triggered, counter 44 is reset and the sequence repeated. Respective, predetermined frequency values, corresponding to the 256 pulses of each frequency cycle are stored in a memory 46, and a stored frequency value corresponding to the instantaneous value of the count is selected from memory 46 and routed, in digital form, to an output location O/P(1). Although an output signal, generated, as described hereinbefore, has the same periodicity as the variation in magnetron frequency it would not provide an indication of the absolute position of the spinner. To achieve this object a synchronization pulse is generated periodically at the start of each new frequency cycle. This pulse is decoded at 45 and used to reset the binary counter 44. In this way, the required frequency waveform, as illustrated in FIG. 5, is generated in digital form at the output of the memory 46. An analogue output O/P(2) may be provided by a D/A converter 47 and amplifier 48. The digital or analogue output represents the changing magnetron frequency as the spinner rotates and is applied as a reference signal to the receiver local oscillator which is thereby synchronized with the transmitted magnetron frequency.

As described hereinbefore, the synchronization pulses are generated, in this example, by provision of gap after successive groups of seven lines thus generating a discontinuity in the periodicity of pulses applied to amplifier 41 and marking the start of each frequency cycle.

I claim:

1. A magnetron including a rotatable tuning member and a sensing arrangement, responsive to rotation of the tuning member to provide an indication of the instantaneous magnetron frequency, said sensing arrangement comprising a plurality of markings provided on the tuning member and spaced apart about the axis of rotation thereof, a detector responsive to movement of the markings past a fixed reference position as the tuning member rotates to generate respective first electrical pulses, a dividing circuit arranged to divide the period between successive ones of said first electrical pulses into a plurality of sub-periods and to generate respective second electrical pulses, and an output circuit responsive to said second electrical pulses to generate an electrical output signal related to the instantaneous magnetron frequency.

2. A magnetron according to claim 1 wherein said output circuit comprises a counter and a memory, the counter being arranged to count said second electrical pulses and to generate a signal indicative of the particular sub-period representing the position of the tuner, and the memory being arranged to store the pre-determined frequency corresponding to each sub-period, to select the sub-period indicatedby the signal provided by the counter and to generate an output signal indicative of the instantaneous magnetron frequency.

3. A magnetron according to claim 2 wherein said output circuit further comprises means for successively resetting the counter whenever the count attains a value indicative of a predetermined rotation of the tuning member corresponding to a known excursion of the magnetron frequency, whereby the counter generates said output signal indicative of the instantaneous magnetron frequency.

4. A magnetron according to claim 1 wherein the detector is responsive to changes of light intensity at said fixed reference position as the tuning member rotates.

5. A magnetron according to claim 4 wherein the detector is coupled to the said fixed reference position by a fibre optic pipe.

6. A magnetron according to claim 1 wherein the spacing between one pair of adjacent markings in each group of markings corresponding to a complete cycle of the magnetron frequency differs from the spacing between the remaining adjacent pairs of markings and wherein said means for resetting the counter operates in response to the discontinuity in the periodicity of said first electrical pulses to generate a synchronisation signal indicating completion of a frequency cycle.

7. A magnetron according to claim 6 wherein the synchronisation signal is applied to reset the counter.

* * * * *